(12) United States Patent
Oashi

(10) Patent No.: US 6,677,193 B2
(45) Date of Patent: Jan. 13, 2004

(54) METHOD OF PRODUCING SEMICONDUCTOR DEVICE AND ITS STRUCTURE

(75) Inventor: Toshiyuki Oashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/255,619

(22) Filed: Sep. 27, 2002

(65) Prior Publication Data

US 2003/0064553 A1 Apr. 3, 2003

(30) Foreign Application Priority Data

Sep. 28, 2001 (JP) ........................................ 2001-301180

(51) Int. Cl.[7] .................... H01L 21/336; H01L 21/8234
(52) U.S. Cl. ........................................ 438/197; 438/206
(58) Field of Search ................................ 438/164, 197, 438/205, 209, 236, 267, 306, 592, 206, 257

(56) References Cited

U.S. PATENT DOCUMENTS 6,372,562 B1 * 4/2002 Matsumoto

FOREIGN PATENT DOCUMENTS

| JP | 2000-200833 | 7/2000 |
|---|---|---|
| JP | 2001-53151 | 2/2001 |

* cited by examiner

Primary Examiner—Phuc T. Dang
(74) Attorney, Agent, or Firm—Burns, Doane, Swecker & Mathis, LLP

(57) ABSTRACT

A method of producing a semiconductor device having an SOI transistor and a multi-layer wiring, including: preparing a silicon substrate having a front face and a back face; forming an inter-layer insulation layer on the front face of the silicon substrate; forming a multi-layer wiring in the inter-layer insulation layer; fixing a substrate on the inter-layer insulation layer; thinning the silicon substrate from the back face into a thin film so that the silicon substrate becomes an SOI layer; and forming a channel layer and a gate electrode on a back of the channel layer in the SOI layer, and further forming a source and a drain facing each other having the channel layer in between so that an SOI transistor is obtained.

7 Claims, 12 Drawing Sheets

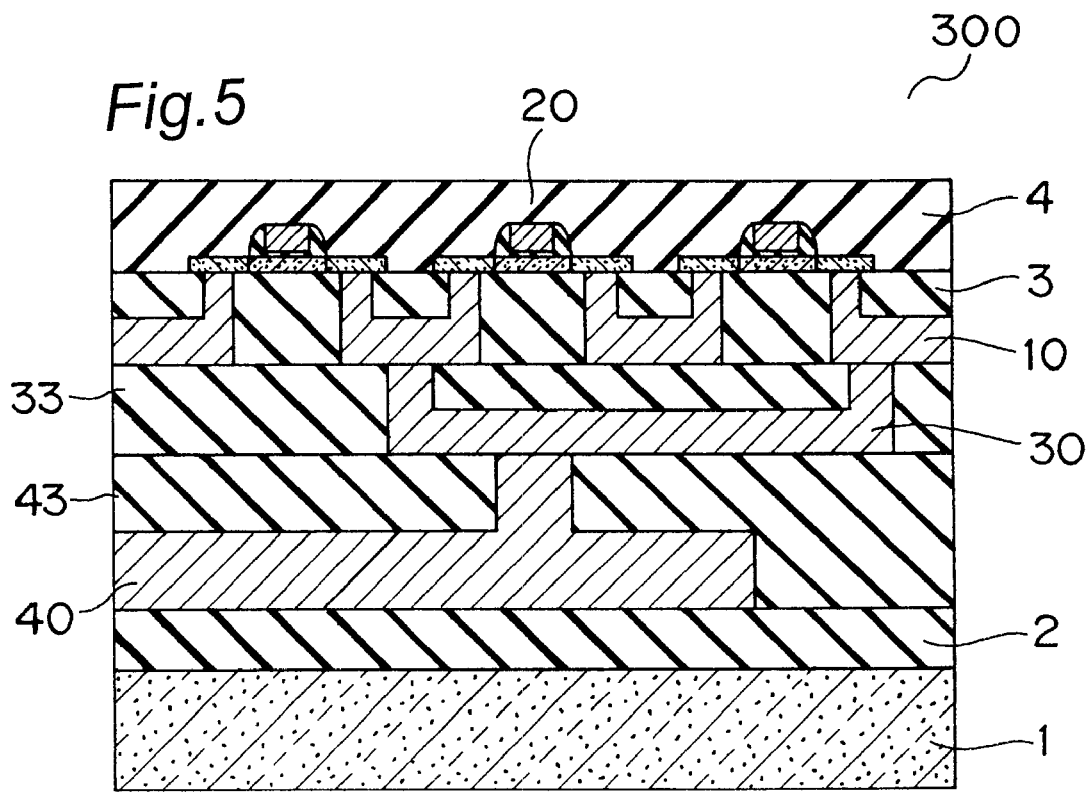

US 6,677,193 B2

METHOD OF PRODUCING SEMICONDUCTOR DEVICE AND ITS STRUCTURE

CROSS-REFERENCE TO RELATED APPLICATIONS

A related patent application is a commonly assigned Japanese Patent Application No. 2001-301180 filed on Sep. 28, 2001, which is incorporated by reference into the present patent application.

BACKGROUND OF THE INVENTION

1. Field of the Invention

The present invention relates to a method of producing a semiconductor device having multi-layer wiring structure and the structure of such a semiconductor device, and more particularly, to a method adopting damascene process for producing a semiconductor device having a multi-layer wiring and the structure of such a semiconductor device.

2. Description of the Related Art

FIG. 10 shows a semiconductor device having conventional multi-layer wiring structure indicated in its entirety by 600. In the semiconductor device 600, there is an insulation layer 102 of silicon oxide disposed on a silicon substrate 101. Formed on the insulation layer 102 is an SOI (Silicon On Insulator) transistor (thin film transistor) indicated in its entirety by 110. The SOI transistor 110 includes a channel layer 113 located between a source 111 and a drain 112, a gate electrode 114 disposed on the channel layer 113, and a side wall 115. An inter-layer insulation layer 103 and a multi-layer wiring 120 are formed on the SOI transistor 110. The multi-layer wiring 120 consists of contact plugs 121 connected to the source 111 or the drain 112 of the SOI transistor 110 and a wiring layer 122 which connects the contact plugs 121 to each other.

When the inter-layer insulation layer 103 is deposited on the SOI transistor 110, asperities owing to the gate electrode and the like cause differences in level to be created on the surface of the inter-layer insulation layer 103 as shown in FIG. 11. This makes it difficult to create a focus margin for a lithography step of forming the contact plugs 121 and the like in the inter-layer insulation layer 103, and especially, to form the contact plugs 121 and the like when the contact plugs 121 and the like are to be formed in minute patterns. While an alternative approach is planarization of the surface of the inter-layer insulation layer 103 by the CMP method, since such planarization has a limitation, it is difficult to ensure that the surface is sufficiently flat to form the contact plugs and the like as minute patterns.

In addition, there is a limit to improvement in density of wiring even by means of a multi-layer wiring structure as that shown in FIG. 10.

SUMMARY OF THE INVENTION

The present invention aims at providing a method of producing a semiconductor device having a multi-layer wiring structure of minute definition and high density as well as the structure of such a semiconductor device.

The present invention is directed to a producing method of producing a semiconductor device including an SOI transistor and a multi-layer wiring. The method includes a step of preparing a silicon substrate having a front face and a back face; an inter-layer insulation layer forming step of forming an inter-layer insulation layer on the front face of the silicon substrate; a wiring step of forming a multi-layer wiring in the inter-layer insulation layer; a substrate fixing step of fixing a substrate on the inter-layer insulation layer; an SOI layer forming step of thinning the silicon substrate from the back face into a thin film so that the silicon substrate becomes an SOI layer; and a transistor forming step of forming a channel layer and a gate electrode on a back face of the formed channel layer, in the SOI layer and further forming a source and a drain facing each other having the channel layer in between so that an SOI transistor is obtained.

The present invention is also directed to a semiconductor device having an SOI transistor and a multi-layer wiring. The device includes a substrate; an inter-layer insulation layer disposed on the substrate; and on the inter-layer insulation layer disposed an SOI transistor including a gate electrode on the opposite side to the substrate. A multi-layer wiring connected with the SOI transistor is provided within the inter-layer insulation layer.

BRIEF DESCRIPTION OF THE DRAWINGS

FIG. 5 is a cross sectional view of the semiconductor device according to the third preferred embodiment of the present invention;

DETAILED DESCRIPTION OF THE PREFERRED EMBODIMENTS

First Preferred Embodiment

Figure 1:
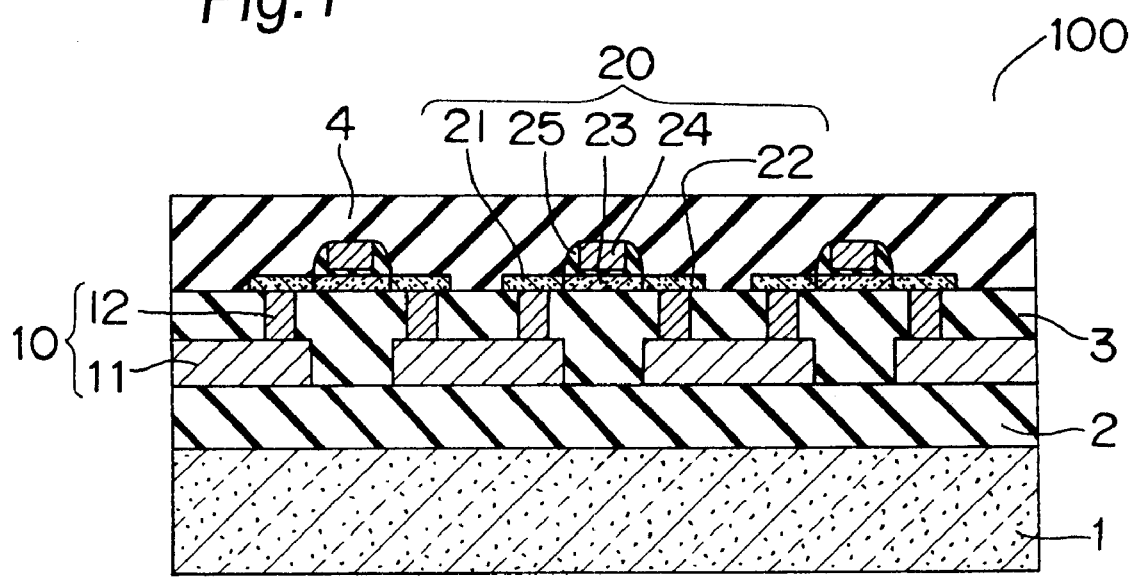
FIG. 1 is a cross sectional view of the semiconductor device according to the first preferred embodiment of the present invention.

FIG. 1 is a cross sectional view of a semiconductor device according to a first preferred embodiment, indicated in its entirety by 100, having a multi-layer wiring structure.

The semiconductor device 100 includes a substrate 1 of silicon for instance. An insulation layer 2 of silicon oxide for example is disposed on the substrate 1. An inter-layer insulation layer 3 is disposed on the insulation layer 2, and a multi-layer wiring consisting of a wiring layer 11 and contact plugs 12 is formed in the inter-layer insulation layer 3. An SOI transistor (thin film transistor) 20 is formed on the inter-layer insulation layer 3. The SOI transistor 20 includes a source 21, a drain 22, a channel layer 23 located between the source 21 and the drain 22, and a gate electrode 24 and a side wall 25 both formed on the channel layer 23. A protection film 4 of silicon oxide for example is disposed on the SOI transistor 20.

A method of producing the semiconductor device 100 according to the first preferred embodiment will now be described with reference to FIGS. 2A to 2J. The producing method includes the steps 1 through 10 described below. In this producing method, a multi-layer wiring is formed using single damascene process (Steps 2 through 5).

Figure 2A:
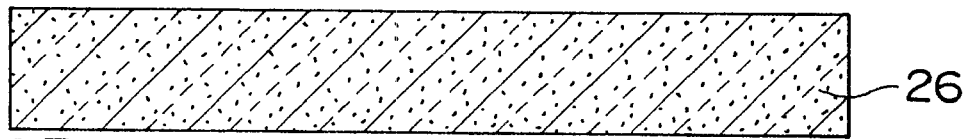
FIGS. 2A–2J show the steps of producing the semiconductor device according to the first preferred embodiment of the present invention.

Step 1: As shown in FIG. 2A, a substrate 26 of silicon for instance is prepared.

Figure 2B:
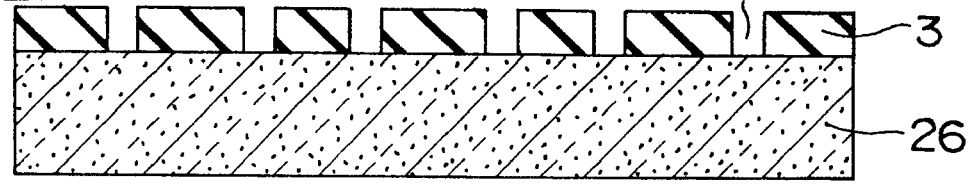

Step 2: As shown in FIG. 2B, the inter-layer insulation layer 3 of silicon oxide for example is deposited about 400 nm in thickness on the substrate 26. The CVD method for instance is used at the deposition step. Following this, contact holes 13 are formed with generally used lithographic and etching techniques.

During these steps, since the element underlying the inter-layer insulation layer 3 is the flat substrate 26, the surface of the inter-layer insulation layer 3 is also flat.

Figure 2C:
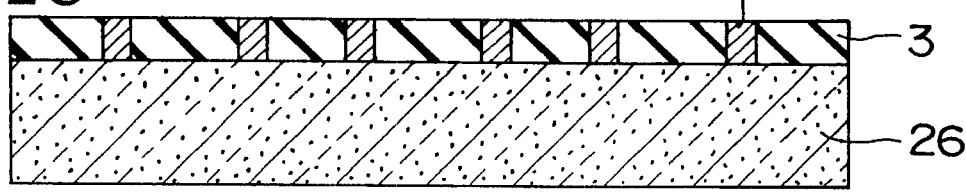

Step 3: As shown in FIG. 2C, a barrier metal film consisting of a TiN film of 10 nm and a Ti film of 10 nm for example, and a W film of 300 nm for instance are formed such that the contact holes 13 are filled up with these films. The CVD method for instance is used at this step. Following this, the W film and the barrier metal film on the inter-layer insulation layer 3 are removed by the CMP method, whereby the contact plugs 12 filling the opening portions are obtained.

Figure 2D:
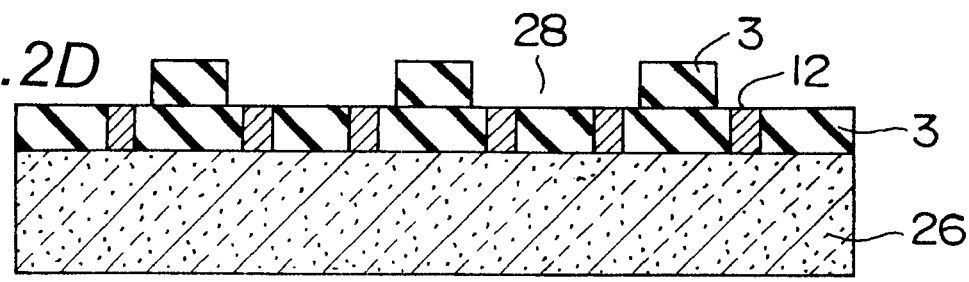

Step 4: As shown in FIG. 2D, the inter-layer insulation layer 3 is further deposited and then patterned, thereby forming wiring trenches 28.

Figure 2E:
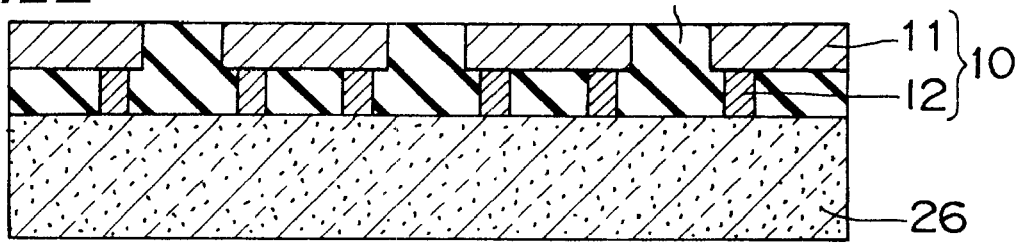

Step 5: As shown in FIG. 2E, a barrier metal film of a Ta film is formed by sputtering, and further a Cu film is formed by electrolytic plating. Following this, the barrier metal film and the Cu film formed on the inter-layer insulation layer 3 are removed by the CMP method, whereby the wiring layer 11 filling the wiring trenches 28 is obtained. Thus, a multi-layer wiring 10 consisting of the contact plugs 12 and the wiring layer 11 is formed.

Figure 2F:
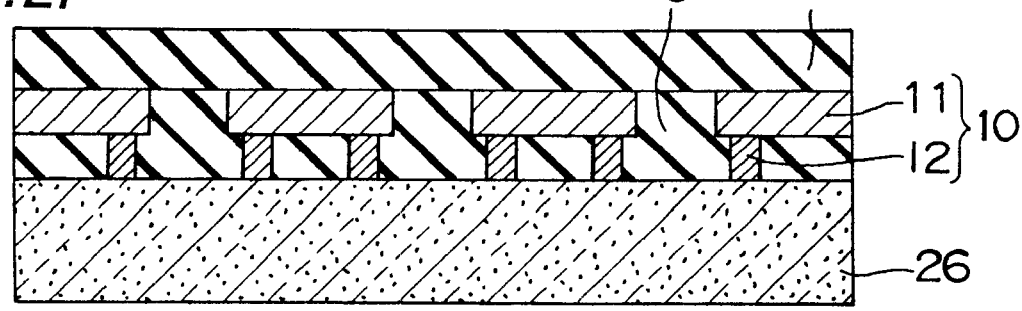

Step 6: As shown in FIG. 2F, the insulation layer 2 of silicon oxide of 1 μm for example is formed on the inter-layer insulation layer 3 by CVD method.

Figure 2G:
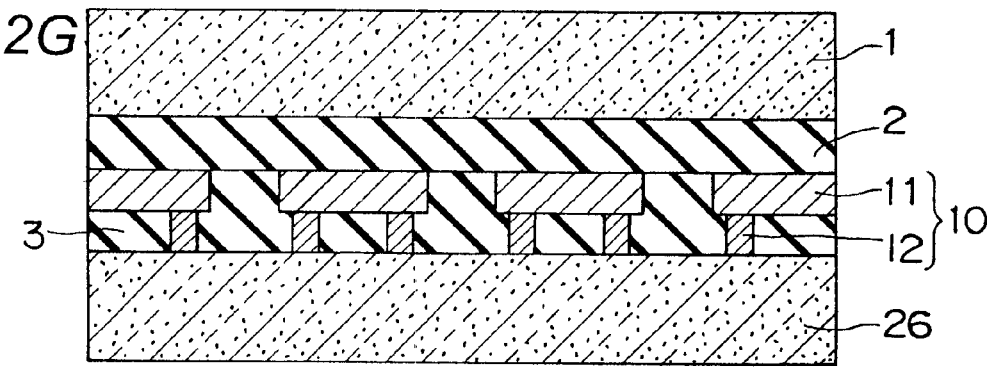

Step 7: As shown in FIG. 2G, the substrate 1 of silicon or the like prepared separately is bonded onto the insulation layer 2. The substrate 1 to be placed on the insulation layer 2 is bonded by heating under pressure.

Figure 2H:
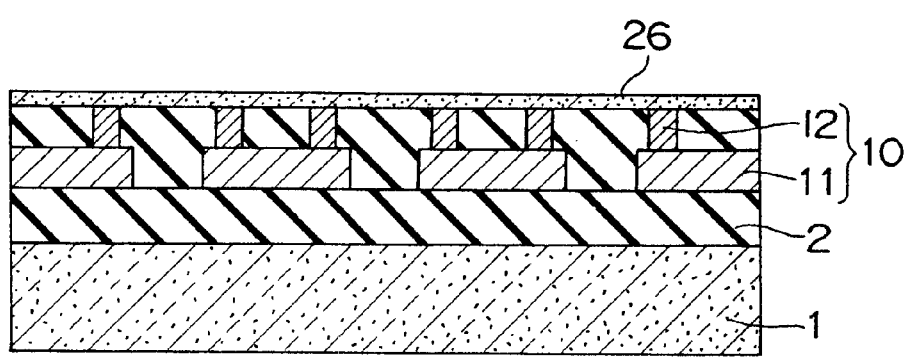

Step 8: As shown in FIG. 2H, using a mechanical polishing method for instance, the substrate 26 is thinned down to 500 nm or less, or preferably down to about 100 nm. Thus thinned substrate 26 becomes an SOI layer for a SOI transistor creation therein.

Note that the top and the bottom sides in FIG. 2H and the subsequent drawings are shown vertically opposite to those in FIG. 2G and the preceding drawings.

Figure 2I:
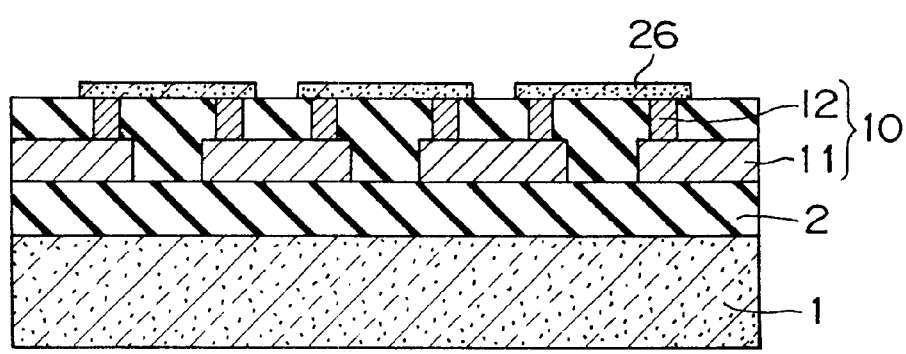

Step 9: As shown in FIG. 2I, the substrate (SOI layer) 26 is etched to realize element isolation (mesa isolation). This is followed by ion implantation (channel implantation) in order to make the entire substrate 26 obtain necessary concentration for a channel layer.

Figure 2J:
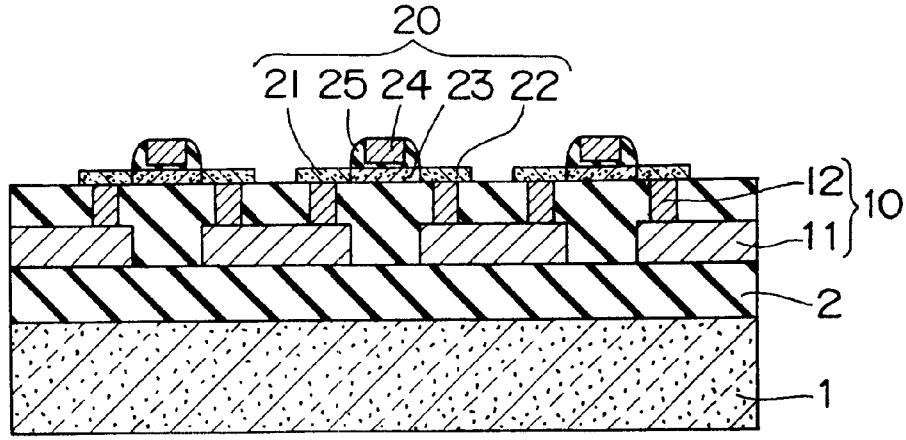

Step 10: As shown in FIG. 2J, after forming a gate oxide film of silicon oxide of about 3 nm for example on the substrate 26, a polycrystalline silicon film for instance is deposited over the entire surface. The polycrystalline silicon film is then patterned, whereby the gate electrode 24 is defined. Following this, after depositing a silicon oxide film for instance by the CVD method over the entire surface, a side wall 25 is formed on side surfaces of the gate electrode 24 by etching. Ion implantation is thereafter performed using the gate electrode 24 and the side wall 25 as a mask, so that the source 21 and the drain 22 are respectively formed on the sides of the gate electrode 24. At last, the protection film 4 of silicon oxide for example is disposed over the entire surface by the CVD method.

Through these steps, the semiconductor device 100 having the multi-layer wiring structure shown in FIG. 1 is completed.

Thus, with the method of producing the semiconductor device 100 according to the first preferred embodiment, before forming the SOI transistor 20, the multi-layer wiring 10 is formed below the SOI transistor 20 whose surface has differences in level. This improves the flatness of the top surface of the inter-layer insulation layer 3, enables to lithographically form minute patterns such as the contact plugs 12, and permits to form the multi-layer wiring 10 providing minuteness. This also increases the flexibility of wiring and makes it possible to fabricate a highly integrated semiconductor device.

Second Preferred Embodiment

Figure 3:
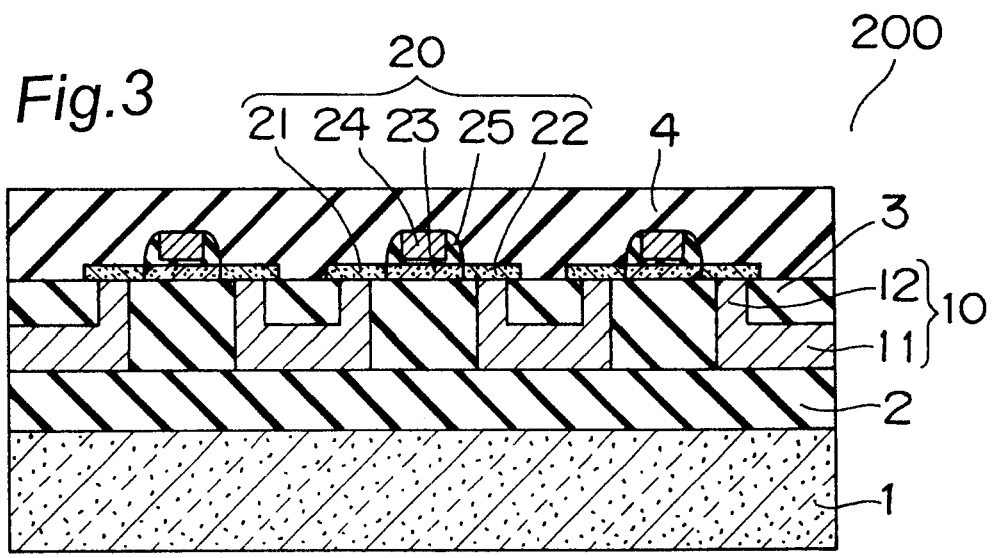
FIG. 3 is a cross sectional view of the semiconductor device according to the second preferred embodiment of the present invention.

FIG. 3 shows a semiconductor device according to a second preferred embodiment, indicated in its entirety by 200 having multi-layer wiring structure. In FIG. 3, the same reference numerals as those used in FIG. 1 denote identical or corresponding portions.

In this semiconductor device 200, the wiring layer 11 of the multi-layer wiring 10 and the contact plugs 12 are formed simultaneously by the dual damascene process.

Figure 4A:
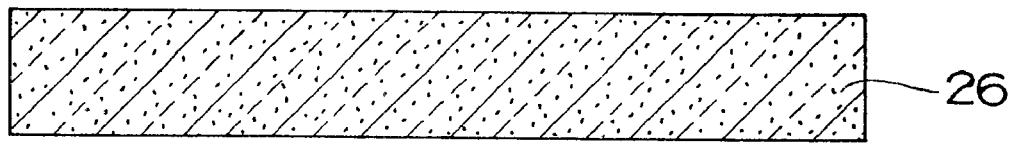
FIGS. 4A–4E show the steps of producing the semiconductor device according to the second preferred embodiment of the present invention.
Figure 4B:
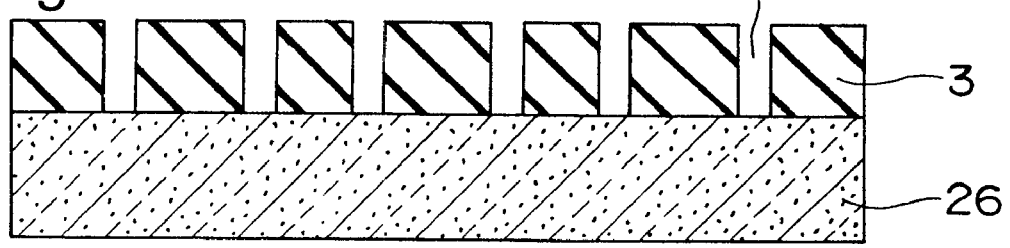

A method of producing the semiconductor device 200 according to the second preferred embodiment will now be briefly described with reference to FIGS. 4A–4E. First, the substrate 26 of silicon for instance is prepared as shown in FIG. 4A, and the inter-layer insulation layer 3 of silicon oxide for example is thereafter deposited as shown in FIG. 4B, whereby contact holes 13 are formed.

Figure 4C:
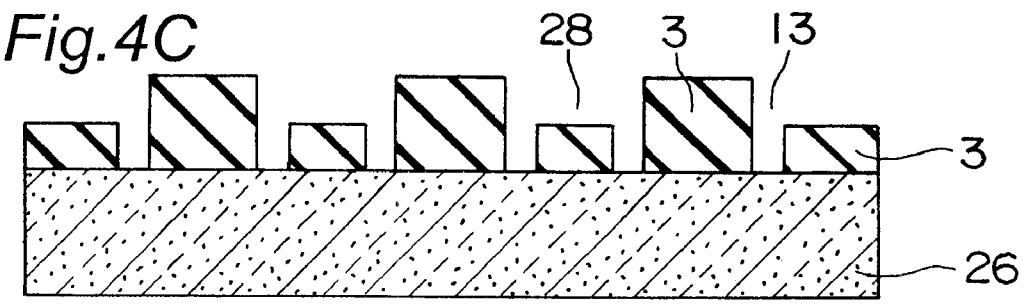

Next, as shown in FIG. 4C, the wiring trenches 28 are formed by etching.

Figure 4D:
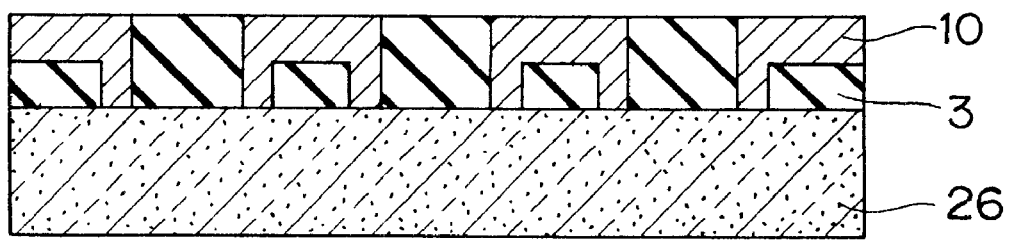

Next, as shown in FIG. 4D, a barrier metal film of a Ta film is formed by sputtering, and further a Cu film is formed by sputtering and electrolytic plating. Following this, the barrier metal film and the Cu film which are on the inter-layer insulation layer 3 are removed by the CMP method, and then the wiring layer 11 filling the wiring trenches 28 and the contact plugs 12 filling the contact holes 13 are formed simultaneously (dual damascene process). As a result, the multi-layer wiring 10 consisting of the contact plugs 12 and the wiring layer 11 is formed.

Figure 4E:
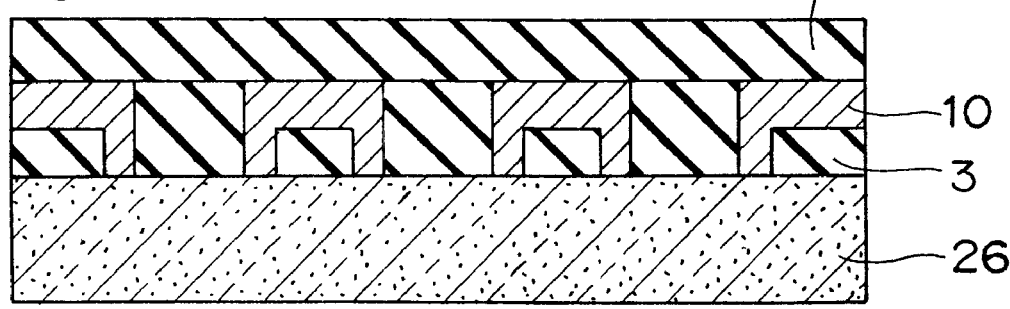

Next, as shown in FIG. 4E, the steps 7 through 10 according to the first preferred embodiment described above (FIGS. 2G–2J) are executed after forming the insulation layer 2 of silicon oxide for example, thereby completing the semiconductor device 200.

As described above, the SOI transistor 20 is formed on the multi-layer wiring 10 as required by the method of producing the semiconductor device 200 according to the second preferred embodiment, and therefore, it is possible to easily form multi-layer wiring structure of high minuteness and integration. Use of the dual damascene process in particular enables to simplify the producing steps.

Third Preferred Embodiment

FIG. 5 shows a semiconductor device according to a third preferred embodiment, indicated in its entirety by 300, having multi-layer wiring structure. In FIG. 5, the same reference numerals as those used in FIG. 1 denote identical or corresponding portions.

The semiconductor device 300 further includes multi-layer wirings 30 and 40 disposed in a lower layer portion of the semiconductor device 200 described earlier.

A method of producing the semiconductor device 300 according to the third preferred embodiment will now be described with reference to FIGS. 6A–6H. The steps shown in FIGS. 6A–6D are similar to the steps shown in FIGS. 4A–4D which represents the second preferred embodiment.

Figure 6A:
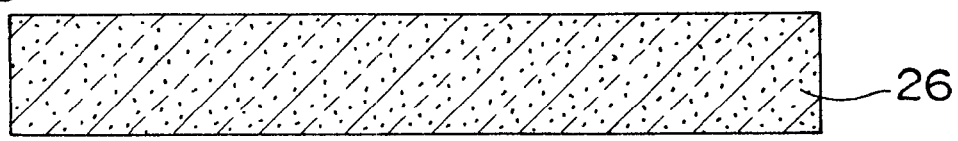
FIGS. 6A–6H show the steps of producing the semiconductor device according to the third preferred embodiment of the present invention.
Figure 6B:
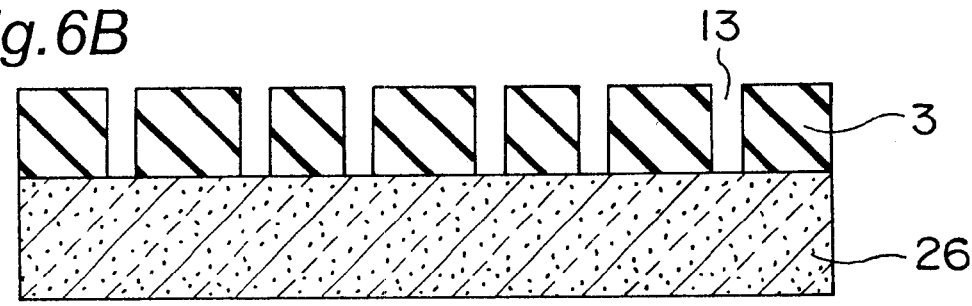
Figure 6C:
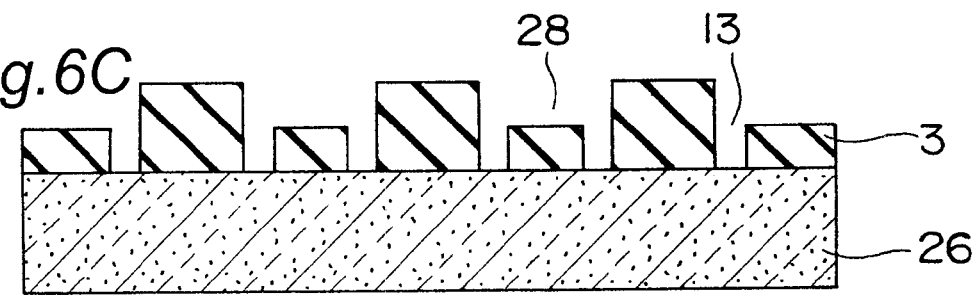
Figure 6D:
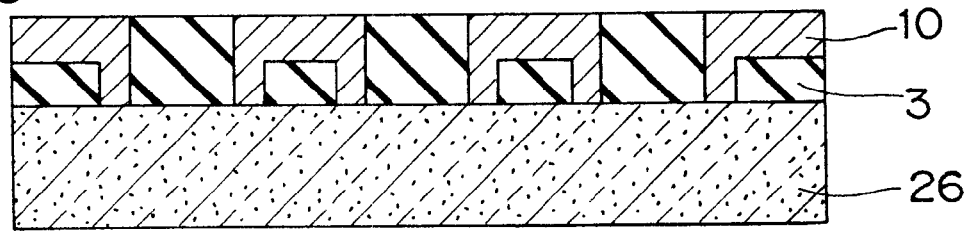
Figure 6E:
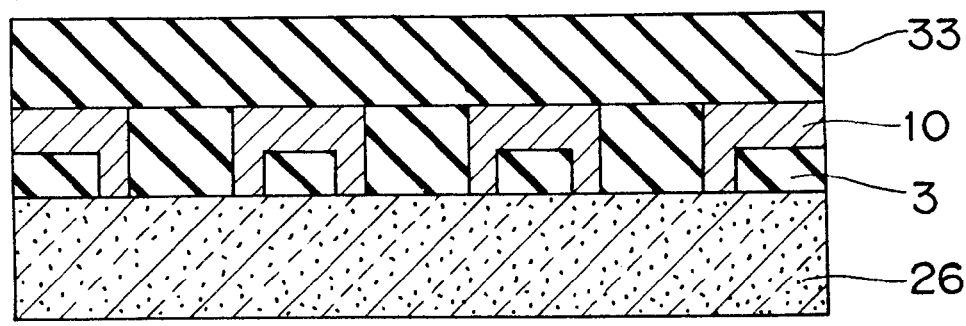

Following these steps, as shown in FIG. 6E, a second inter-layer insulation layer 33 of silicon oxide for example is deposited on the inter-layer insulation layer 3 where the multi-layer wiring 10 is formed.

Figure 6F:
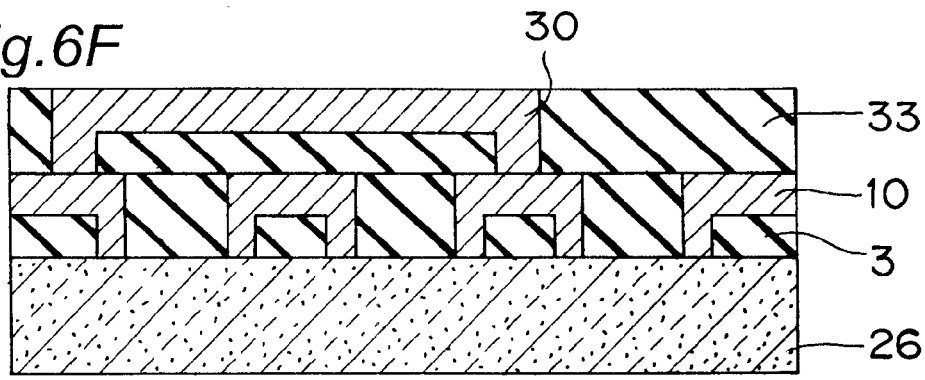
Figure 6G:
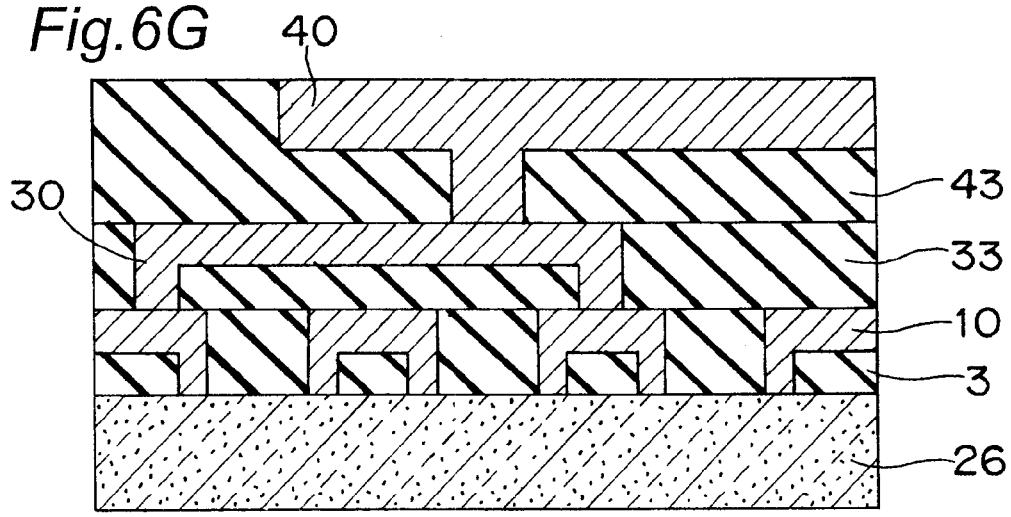
Figure 6H:
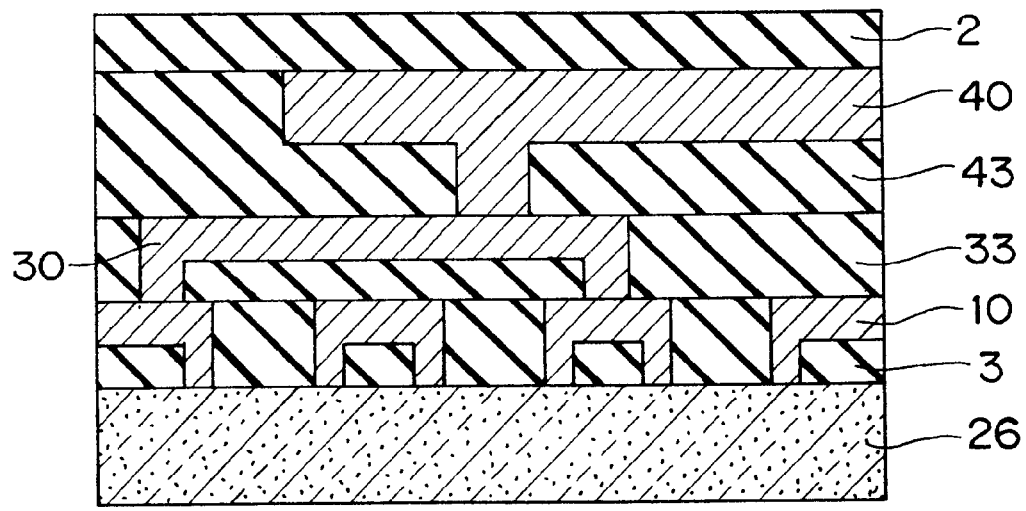

Next, as shown in FIG. 6F, by the same dual damascene process as that at the step of forming the multi-layer wiring 10, the multi-layer wiring 30 is formed in the second inter-layer insulation layer 33.

A third inter-layer insulation layer 43 of silicon oxide for example is then deposited on the second inter-layer insulation layer 33. Following this, by the same dual damascene process as that at the step of forming the multi-layer wiring 30, the multi-layer wiring 40 are formed in the third inter-layer insulation layer 43.

The insulation layer 2 of silicon oxide for example is further deposited on the third inter-layer insulation layer 43.

Next, the steps 7 through 10 according to the first preferred embodiment described above (FIGS. 2G–2J) are executed, whereby the semiconductor device 300 is completed.

Since the SOI transistor 20 is formed after forming the multi-layer wiring structures 10, 30 and 40 in the method of producing the semiconductor device 300 according to the third preferred embodiment, the multi-layer wiring structure can be fabricated while the underlying elements are flat. This allows to easily form even multi-layer wiring of a microfabricated structure. Particularly since the multi-layer wiring structures are formed by the dual damascene process promising high planarization on its surface, it is possible to stack minute multi-layer wiring one atop the other.

Although the foregoing has described the third preferred embodiment in relation to an example wherein the dual damascene process is used, the single damascene process may be used as that according to the first preferred embodiment.

Fourth Preferred Embodiment

Figure 7:
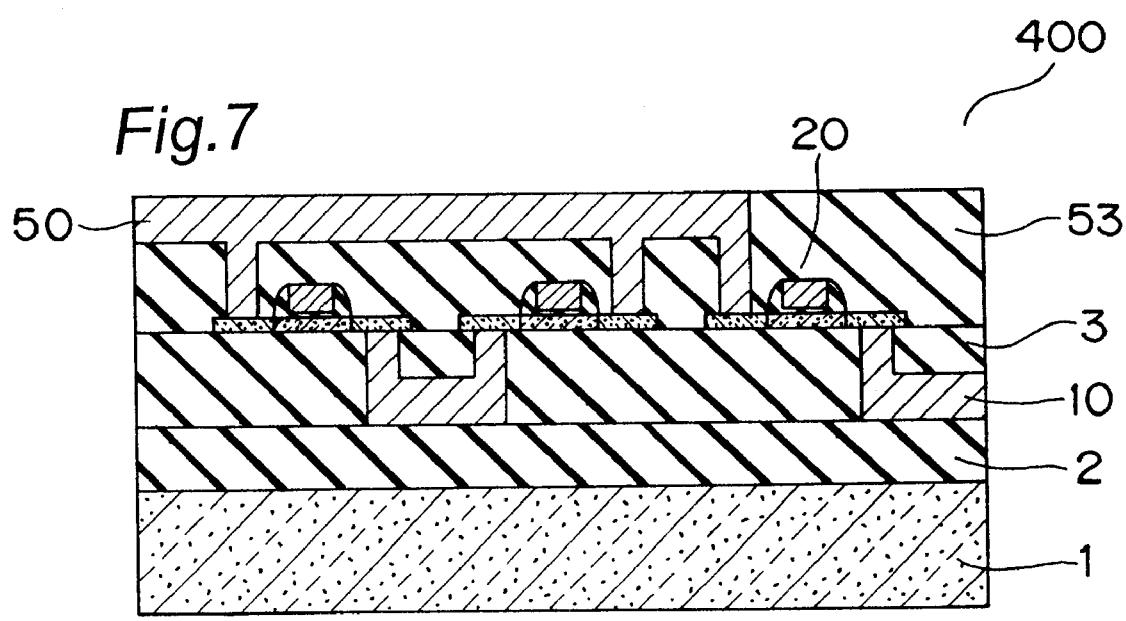
FIG. 7 is a cross sectional view of the semiconductor device according to the fourth preferred embodiment of the present invention.

FIG. 7 shows a semiconductor device according to a fourth preferred embodiment, indicated in its entirety by 400, having multi-layer wiring structure. In FIG. 7, the same reference numerals as those used in FIG. 1 denote identical or corresponding portions.

In the semiconductor device 400, the multi-layer wiring 10 is disposed below the SOI transistor 20, while a multi-layer wiring 50 is disposed above the SOI transistor 20.

With respect to use of such a semiconductor device 400, the flexibility of wiring is more improved than the case that the multi-layer wiring is formed only above or below the SOI transistor 20. And eventually it is suitable for integration of the semiconductor device 400.

A method of producing the semiconductor device 400 according to the fourth preferred embodiment will now be described with reference to FIGS. 8A–8C.

Figure 8A:
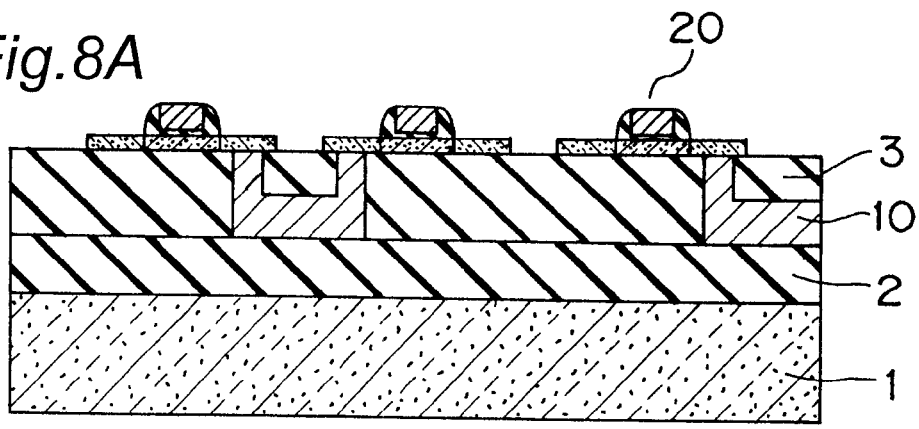
FIGS. 8A–8C show the steps of producing the semiconductor device according to the fourth preferred embodiment of the present invention.

First, as shown in FIG. 8A, through steps similar to those used in the second preferred embodiment, the SOI transistor 20 is formed on the inter-layer insulation layer 3 in which the multi-layer wiring 10 is formed.

Figure 8B:
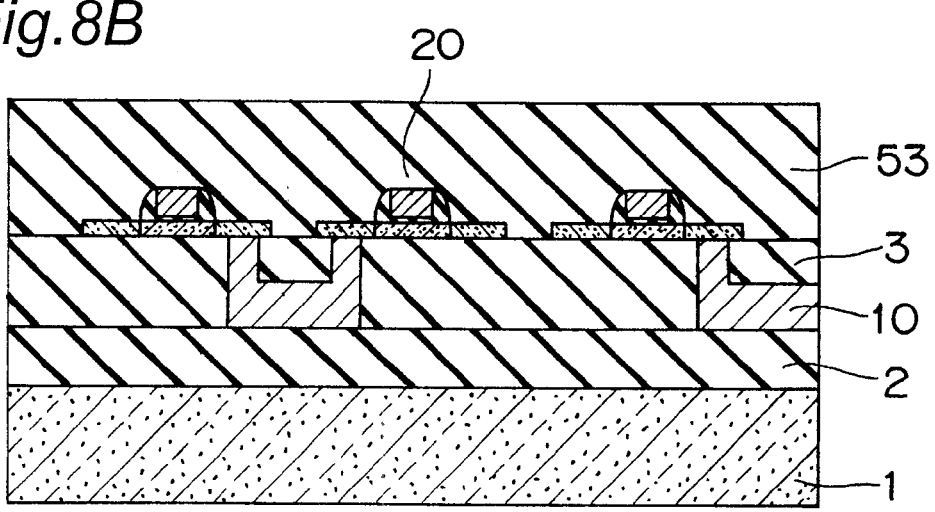

Next, as shown in FIG. 8B, a fourth inter-layer insulation layer 53 of silicon oxide for example is deposited.

Figure 8C:
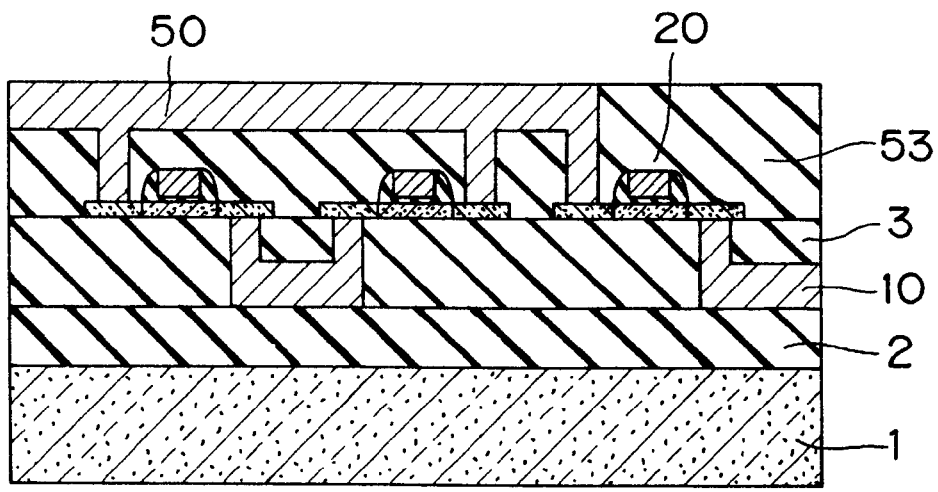
Figure 9:
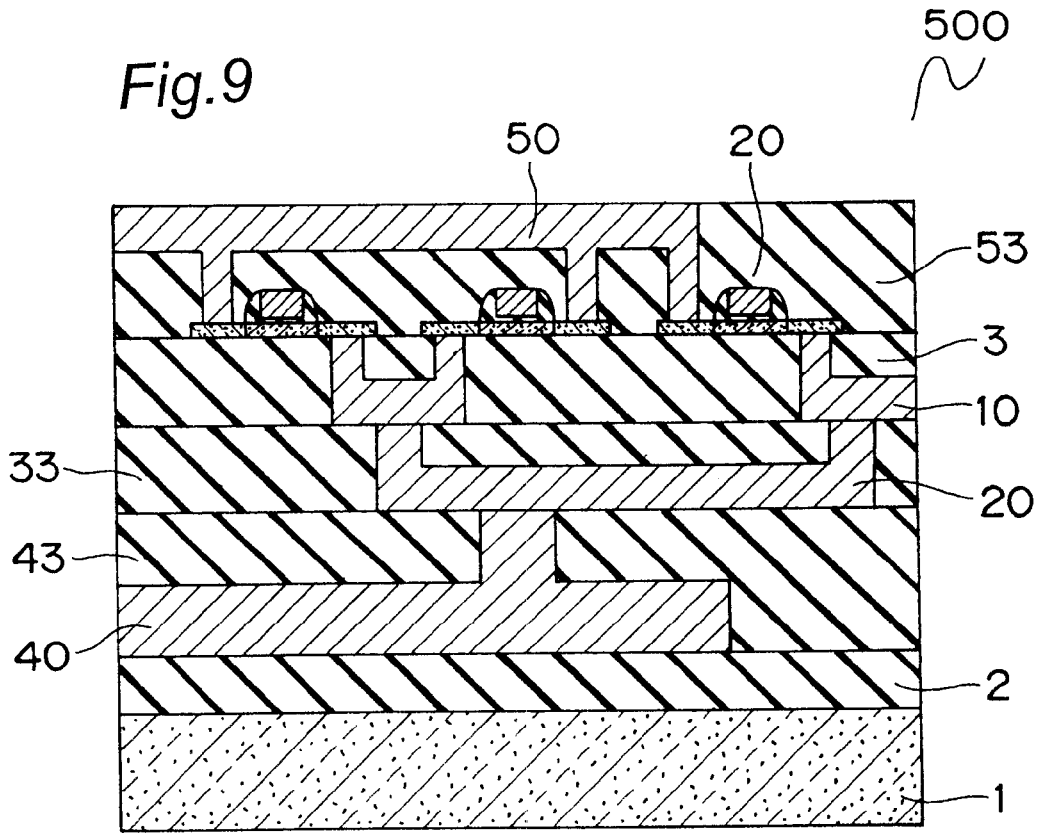
FIG. 9 is a cross sectional view of the semiconductor device according to the fifth preferred embodiment of the present invention.
Figure 10:
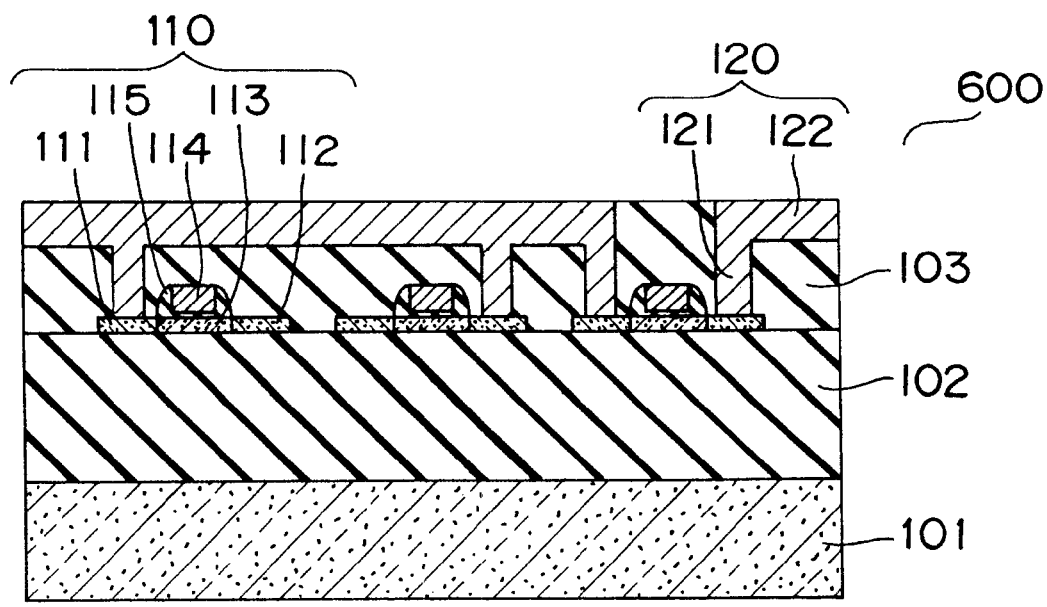
FIG. 10 is a cross sectional view of the conventional semiconductor device.

Then, as shown in FIG. 8C, the multi-layer wiring 50 is formed by the dual damascene process. Since the multi-layer wiring 50 is formed above the SOI transistor 20, the surface of the fourth inter-layer insulation layer 53 is less planar than the surface of the inter-layer insulation layer 3. Hence, the multi-layer wiring 50 can not be formed as minute as the multi-layer wiring 10 in some cases.

Further, the single damascene process as that according to the first preferred embodiment may be applied to form the multi-layer wiring 10 and 50.

Thus, the method of producing the semiconductor device 400 according to the fourth preferred embodiment ensures that the multi-layer wiring below the SOI transistor 20 is minutely defined.

In addition, use of such a structure improves the flexibility of wiring in the semiconductor device and accordingly enables to realize integration of the semiconductor device.

Fifth Preferred Embodiment

Figure 11:
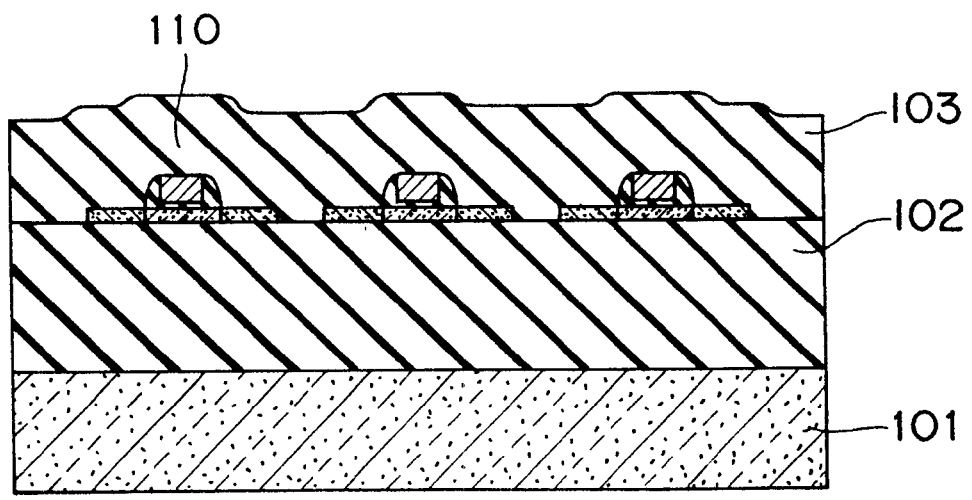
FIG. 11 is a cross sectional view of the conventional semiconductor device as it is being produced.

FIG. 11 shows a semiconductor device according to a fifth preferred embodiment, indicated in its entirety by 500, having multi-layer wiring structure. In FIG. 11, the same reference symbols as those used in FIG. 1 denote identical or corresponding portions.

In the semiconductor device 500, as in the semiconductor device 300, the multi-layer wirings 10, 30 and 40 are disposed below the SOI transistor 20. Further, the multi-layer wiring 50 is disposed above the SOI transistor 20.

Use of such a structure further improves the flexibility of the semiconductor device. And eventually it is suitable for integration of the semiconductor device.

After forming the multi-layer wirings 10, 30 and 40 through the producing steps according to the third preferred embodiment, the semiconductor device 500 is fabricated by forming the multi-layer wiring 50 above the SOI transistor 20 as in the fourth preferred embodiment.

Wiring layers may be further stacked both below and above the SOI transistor 20. In addition, any one of the damascene process and the dual damascene process may be used to form the multi-layer wirings.

What is claimed is:

1. A method of producing a semiconductor device having an SOI (Silicon On Insulator) transistor and a multi-layer wiring, comprising:

a step of preparing a silicon substrate having a front face and a back face;

an inter-layer insulation layer forming step of forming an inter-layer insulation layer on the front face of said silicon substrate;

a wiring step of forming a multi-layer wiring via contact holes and wiring trenches in said inter-layer insulation layer;

a substrate fixing step of fixing a substrate on said inter-layer insulation layer;

an SOI (Silicon On Insulator) layer forming step of thinning said silicon substrate from the back face into a thin film so that said silicon substrate becomes an SOI layer; and a transistor forming step of forming a channel layer and a gate electrode on a back of said channel layer in said SOI layer, and further forming a source and a drain facing each other having said channel layer in between so that an SOI transistor is obtained.

2. A producing method according to claim 1, characterized in that said wiring step comprises the steps of:

forming a contact hole and a wiring trench in said inter-layer insulation layer;

depositing a conductive material layer for filling said contact hole and said wiring trench, on said inter-layer insulation layer; and polishing said conductive material layer from a top surface of said inter-layer insulation layer so that said conductive material layer remains within said contact hole and said wiring trench, and accordingly forms a multi-layer wiring.

3. A producing method according to claim 1, characterized in that said wiring step comprises:

a contact plug forming step of:

forming a contact hole in said inter-layer insulation layer;

depositing a conductive material layer for filling said contact hole; and polishing said conductive material layer from a top surface of said inter-layer insulation layer so that said conductive material layer remains within said contact hole and accordingly becomes a contact plug; and a wiring layer forming step of:

forming a wiring layer on said inter-layer insulation layer; and depositing a second inter-layer insulation layer on said wiring layer.

4. A producing method according to claim 1, characterized in that said wiring step comprises:

a contact plug forming step of:

forming a contact hole in said inter-layer insulation layer;

depositing a conductive material layer for filling said contact hole; and polishing said conductive material layer from a top surface of said inter-layer insulation layer so that said conductive material layer remains within said contact hole and accordingly becomes a contact plug; and a wiring layer forming step of:

depositing a second inter-layer insulation layer on said inter-layer insulation layer;

forming a wiring trench in said second inter-layer insulation layer;

depositing a second conductive material layer for filling said wiring trench on said second inter-layer insulation layer; and polishing said second conductive material layer from a top surface of said second inter-layer insulation layer so that said second conductive material layer remains within said wiring trench and accordingly forms a wiring layer.

5. A producing method according to claim 1, characterized in that said SOI layer forming step comprises a step of forming an isolation groove on said silicon substrate after said silicon substrate is thinned into a thin film and thereafter forming a plurality of SOI layers isolated electrically from each other.

6. A producing method according to claim 1, characterized by requiring to execute a combinational step of said inter-layer insulation layer forming step and said wiring step more than one time before executing said substrate fixing step.

7. A producing method according to claim 1, characterized by comprising, after said transistor forming step, the steps of:

depositing an inter-layer insulation layer on the gate electrode side of said SOI transistor; and forming a multi-layer wiring connected with said SOI transistor in said inter-layer insulation layer.

* * * * *